(12) United States Patent
Gwoziecki et al.

(10) Patent No.: US 11,404,628 B2
(45) Date of Patent: Aug. 2, 2022

(54) PIEZOELECTRIC TRANSFORMER

(71) Applicant: Commissariat à l'Énergie Atomique et aux Énergies Alternatives, Paris (FR)

(72) Inventors: Romain Gwoziecki, Grenoble (FR); Marine Galliari, Chavanod (FR); Antoine Latour, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 580 days.

(21) Appl. No.: 15/842,620

(22) Filed: Dec. 14, 2017

(65) Prior Publication Data
US 2018/0175280 A1    Jun. 21, 2018

(30) Foreign Application Priority Data
Dec. 19, 2016   (FR) ..................................... 16/62767

(51) Int. Cl.
| | | |
|---|---|---|
| H01L 41/08 | (2006.01) | |
| H01L 41/107 | (2006.01) | |
| H01L 41/193 | (2006.01) | |
| H01L 41/083 | (2006.01) | |

(52) U.S. Cl.
CPC .......... *H01L 41/107* (2013.01); *H01L 41/193* (2013.01); *H01L 41/083* (2013.01)

(58) Field of Classification Search
CPC .... H01L 41/107; H01L 41/093; H01L 41/083
USPC .................................................. 310/359, 800
See application file for complete search history.

(56) References Cited

U.S. PATENT DOCUMENTS

| | | | |
|---|---|---|---|
| 2003/0102774 A1* | 6/2003 | Carazo | H01L 41/107 310/317 |
| 2012/0169184 A1* | 7/2012 | Pelrine | F02G 1/043 310/365 |
| 2013/0127299 A1* | 5/2013 | Kim | H01L 41/0475 310/364 |
| 2015/0044386 A1* | 2/2015 | Vilkomerson | H01L 41/29 427/485 |

FOREIGN PATENT DOCUMENTS

| | | |
|---|---|---|
| EP | 0 915 524 A1 | 5/1999 |
| JP | 2006-041150 A | 2/2006 |

OTHER PUBLICATIONS

French Search Report for Application No. FR 1662767 dated Aug. 4, 2017.

(Continued)

*Primary Examiner* — Derek J Rosenau
(74) *Attorney, Agent, or Firm* — Wolf, Greenfield & Sacks, P.C.

(57) ABSTRACT

A voltage transformer including a beam or membrane made of a first polymer material having a resonance frequency in the range from 1 Hz to 1,000 Hz and including on the beam or membrane a stack successively including: a first electrode; a first piezoelectric layer made of a second polymer material; a second electrode; a second piezoelectric layer made of a third polymer material identical to the second polymer material or different from the second polymer material; and a third electrode.

13 Claims, 3 Drawing Sheets

(56) References Cited

OTHER PUBLICATIONS

Stanchev, Simulation Model of PVDF Piezoelectric Transformer for Medical Applications. Annual Journal of Electronics. 2015;9:30-3.
Vucheva et al., Investigation of MEMS piezoelectric transformer with PVDF thin layer. Materials Science Forum. May 19, 2016;856:356-61.
FR 1662767, Aug. 4, 2017, French Search Report.

* cited by examiner

PIEZOELECTRIC TRANSFORMER

This application claims priority to French patent application number 16/662767, filed Dec. 19, 2016, the content of which is incorporated herein by reference in its entirety to the maximum extent allowable by law.

BACKGROUND

The present disclosure relates to a piezoelectric voltage transformer, and more particularly to a piezoelectric voltage transformer for a voltage having a frequency in the range from 1 Hz to 1,000 Hz.

DISCUSSION OF THE RELATED ART

It is known to use piezoelectric materials, such as piezoelectric ceramics, to form voltage transformers. Such voltage transformers are generally adapted to periodic voltages having a frequency in the range from 10 kHz to 150 kHz. There exist several types of piezoelectric voltage transformers, such as multilayer transformers, circular transformers, or also Rosen transformers.

FIG. 1 is a perspective view of an example of a piezoelectric voltage transformer 1. Transformer 1 is a multilayer-type piezoelectric voltage transformer. Transformer 1 comprises a stack successively comprising, from bottom to top in FIG. 1:

an electrode 3;
a piezoelectric layer 5 having a thickness $h_1$;
an electrode 7;
a piezoelectric layer 9 having a thickness $h_2$; and
an electrode 11.

A periodic input voltage $V_{in}$ is applied between electrodes 3 and 7. Electrodes 3 and 7 being in contact with layer 5, a reverse piezoelectric effect is created and piezoelectric material layer 5 mechanically deforms. The mechanical deformation is communicated to the entire stack and more particularly to piezoelectric layer 9. By direct piezoelectric effect, layer 9 generates an output voltage $V_{out}$ measured between electrodes 11 and 7.

As an example, when the following conditions are gathered:

layers 5 and 9 have identical surface areas;
layers 5 and 9 are made of a same material; and
the thicknesses of electrodes 3, 7 and 11 are negligible as compared with those of layers 5 and 9, voltages $V_{in}$ and $V_{out}$ are linked to each other by the following relation (1):

$$\frac{V_{out}}{h2} = \frac{V_{in}}{h1} \quad (1)$$

The amplification factor thus is the ratio of thickness $h_2$ of layer 9 to thickness $h_1$ of layer 5. Thicknesses $h_1$ and $h_2$ are thus selected according to the desired amplification factor.

Piezoelectric layers 5 and 9 are generally made of piezoelectric ceramics having a Young's modulus greater than 70 GPa, for example, in the order of 100 GPa. For piezoelectric material thicknesses in the range from 1 mm to 10 mm, this type of voltage transformer can process periodic voltages having frequencies in the range from 30 kHz to 100 kHz.

It would be desirable to design a multilayer-type voltage transformer adapted to periodic voltages having frequencies in the range from 1 Hz to 1,000 Hz. Such a transformer would be particularly useful for fields where systems or microsystems based on rotating machine-type generators, such as wind turbines or microturbines, are used. A disadvantage of the multilayer voltage transformer shown in FIG. 1 is that it is not adapted for such frequencies.

SUMMARY

An object of an embodiment is to overcome all or part of the disadvantages of previously-described piezoelectric transformers.

Another object of an embodiment is for the piezoelectric transformer to be usable with periodic voltages having a frequency in the range from 1 Hz to 1,000 Hz.

Another object of an embodiment is for the piezoelectric transformer to comprise piezoelectric materials other than piezoelectric ceramics.

Thus, an embodiment provides a voltage transformer comprising a beam or membrane made of a first polymer material, having a resonance frequency in the range from 1 Hz to 1,000 Hz, and comprising on said beam or membrane a stack successively comprising: a first electrode; a first piezoelectric layer made of a second polymer material; a second electrode; a second piezoelectric layer made of a third polymer material identical to the second polymer material or different from the second polymer material; and a third electrode.

According to an embodiment, the first polymer material has a Young's modulus smaller than 10 GPa.

According to an embodiment, the first polymer material is polyethylene naphthalate or polyethylene terephthalate.

According to an embodiment, the second and third polymer materials comprise polyvinylidene fluoride and/or at least one copolymer of polyvinylidene fluoride, particularly a polymer selected from the group comprising polyvinylidene fluoride, poly(vinylidene fluoride-tri fluoro ethylene), poly(vinylidene fluoride-tetra fluoro ethylene), and a mixture of at least two of these polymers.

According to an embodiment, the transformer further comprises a support and the beam or membrane is fastened by one of its ends to the support.

According to an embodiment, the second polymer material and the third polymer material are identical and the thickness of the first layer is different from the thickness of the second layer.

According to an embodiment, the beam or membrane has a length in the range from 1 mm to 100 mm and a thickness in the range from 50 µm to 200 µm and the first and second layers have a thickness in the range from 1 µm to 50 µm.

According to an embodiment, the stack further successively comprises, between the first piezoelectric layer and the second electrode, a fourth electrode and a third piezoelectric layer made of a fourth polymer material.

According to an embodiment, the fourth polymer material comprises polyvinylidene fluoride and/or at least one copolymer of polyvinylidene fluoride, particularly a polymer selected from the group comprising polyvinylidene fluoride, poly(vinylidene fluoride-tri fluoro ethylene), poly(vinylidene fluoride-tetra fluoro ethylene), and a mixture of at least two of these polymers.

According to an embodiment, the transformer comprises means of application of a first voltage between the fourth electrode and the first electrode and between the fourth electrode and the second electrode and comprises means for recovering a second voltage between the third electrode and the second electrode.

According to an embodiment, the stack further successively comprises, between the third layer and the second electrode, a fifth electrode and a fourth piezoelectric layer made of a fifth polymer material.

According to an embodiment, the fifth polymer material comprises polyvinylidene fluoride and/or at least one copolymer of polyvinylidene fluoride, particularly a polymer selected from the group comprising polyvinylidene fluoride, poly(vinylidene fluoride-tri fluoro ethylene), poly(vinylidene fluoride-tetra fluoro ethylene), and a mixture of at least two of these polymers.

According to an embodiment, the transformer comprises means of application of a first voltage between: the first electrode and the fourth electrode; and fifth electrode and the fourth electrode; and the fifth electrode and the second electrode, and comprising means for recovering a second voltage between the third electrode and the second electrode.

According to an embodiment, the transformer further comprises an element having a controllable stiffness in contact with the stack or in contact with the beam or membrane.

According to an embodiment, the element having a controllable stiffness comprises a fifth piezoelectric layer made of a sixth polymer material.

The foregoing and other features and advantages will be discussed in detail in the following non-limiting description of specific embodiments in connection with the accompanying drawings.

DETAILED DESCRIPTION

Figure 1:
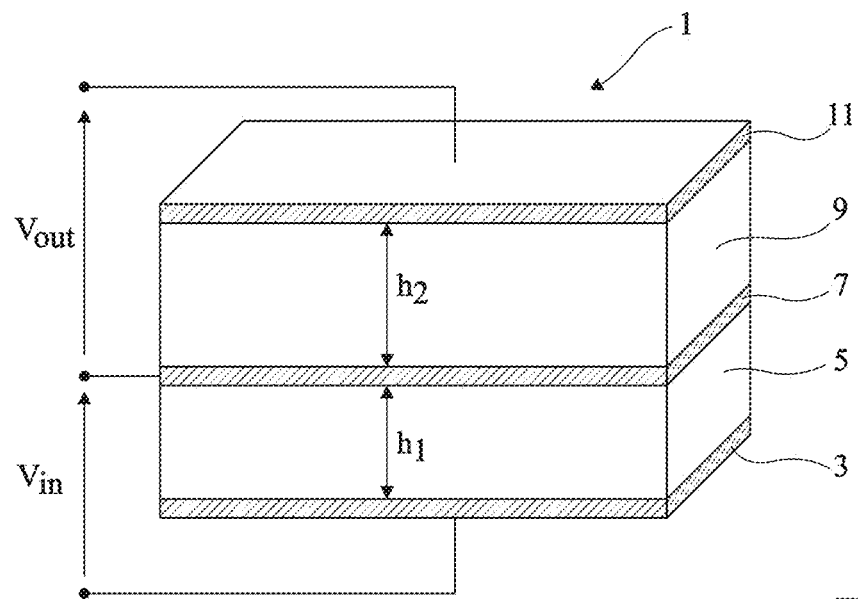
FIG. 1, previously described, illustrates a piezoelectric voltage transformer.

The same elements have been designated with the same reference numerals in the different drawings. For clarity, only those steps and elements which are useful to the understanding of the described embodiments have been shown and are detailed.

In the following description, when reference is made to terms qualifying the absolute position, such as terms "top", "bottom", etc., or the relative position, such as terms "above", "upper", "lower", etc., reference is made to the orientation of the drawings. Unless otherwise specified, expressions "substantially" and "in the order of" mean to within 10%, preferably to within 5%.

In the following description, the Young's modulus of a linear resilient material is defined by the constant which links the tensile or compressive stress and the deformation of the material.

In the following description, expression "element based on polyvinylidene fluoride (PVDF)" means a copolymer comprising at least 70% by molar mass of the vinylidene fluoride monomer (VDF) and possibly of at least another monomer such as, for example, trifluoroethylene (TrFE) or tetrafluoroethylene (TFE).

Figure 2A:
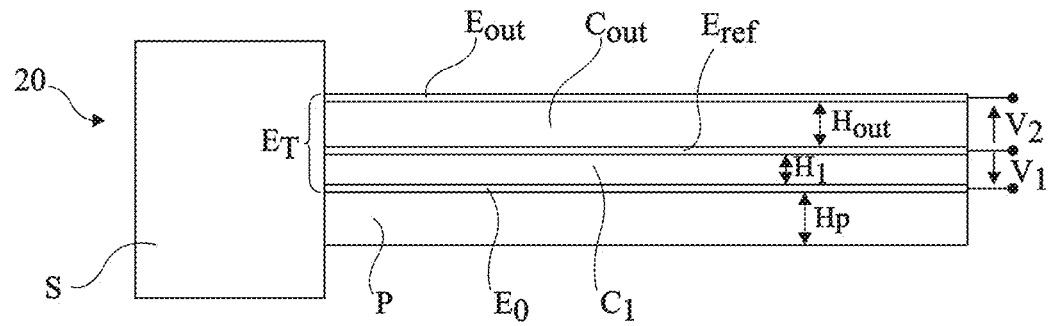
FIGS. 2A and 2B illustrate an embodiment of a piezoelectric voltage transformer.
Figure 2B:
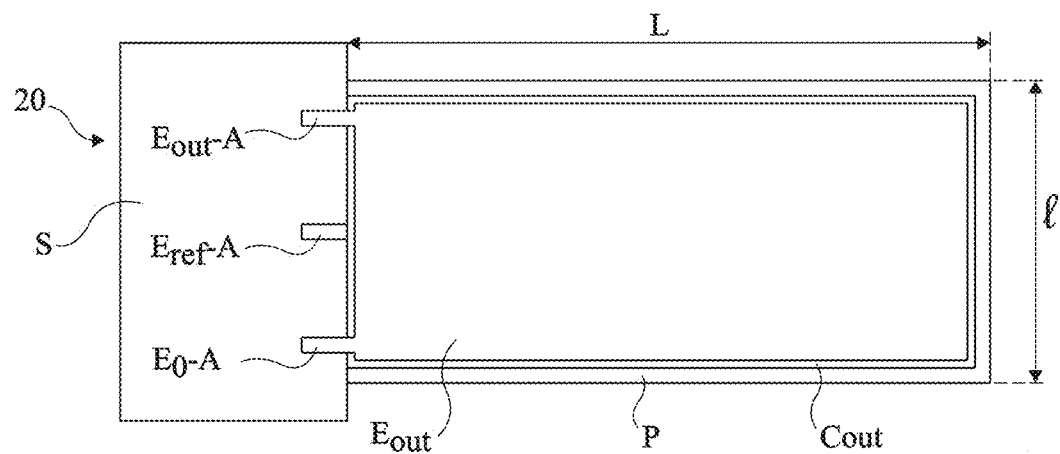

FIGS. 2A and 2B respectively are a cross-section view and a top view, partial and simplified, of an embodiment of a multilayer-type piezoelectric voltage transformer 20. Voltage transformer 20 is adapted to periodic voltages having a frequency in the range from 1 Hz to 1,000 Hz, for example, in the order of 60 Hz.

Transformer 20 comprises a beam or membrane P made of a polymer material and comprises, on beam or membrane P, a stack $E_T$ of piezoelectric layers and of electrode layers. In the following description, it will be spoken of a beam P to designate beam or membrane P. The dimensions and the material of beam P are selected so that its resonance frequency is in the range from 1 Hz to 1,000 Hz, for example, in the order of 60 Hz. The material forming beam P may be a polymer having a Young's modulus smaller than 10 GPa, for example, in the order of 3 GPa. Such a material is for example, polyethylene naphthalate (PEN), polyethylene terephthalate (PET), a polyimide or a polycarbonate. Beam P may be fastened at one of its ends to a support S, for example, by a rigid connection, the other end of beam P being free.

Stack $E_T$ comprises:
- an electrode $E_0$ resting on beam P, for example, in contact with beam P;
- a piezoelectric layer $C_1$ having a thickness $H_1$, made of a polymer material resting on electrode $E_0$, for example, in contact with electrode $E_0$;
- an electrode $E_{ref}$ resting on layer $C_1$, for example, in contact with layer $C_1$;
- a piezoelectric layer $C_{out}$ having a thickness $H_{out}$, made of a polymer material, resting on electrode $E_{ref}$, for example, in contact with electrode $E_{ref}$; and
- an electrode $E_{out}$ resting on layer $C_{out}$, for example, in contact with layer $C_{out}$.

Stack $E_T$ of piezoelectric layers and of electrodes is similar to the piezoelectric voltage transformer previously described in relation with FIG. 1, with the difference that the piezoelectric layers are made of a piezoelectric polymer material.

Piezoelectric layers $C_1$ and $C_{out}$ may be made of a same material or of different materials. Piezoelectric layers $C_1$ and $C_{out}$ are each made of a piezoelectric polymer material, for example, a compound based on PVDF. The PVDF-based compound may comprise the PVDF polymer alone, a single copolymer of PVDF, a mixture of two or more than two PVDF copolymers, or a mixture of the PVDF polymer and of at least one PVDF copolymer. Preferably, the PVDF copolymer is poly(vinylidene fluoride-trifluoro ethylene) (P(VDF-TrFE)), particularly P(VDF$_x$-TrFE$_{100-x}$) where x is a real number between 60 and 80, particularly approximately 70, poly(vinylidene fluoride), poly((vinylidene fluoride-trifluoroethylene-chlorofluoroethylene) (P(VDF-TrFE-CFE), or poly((vinylidene fluoride-trifluoroethylene-chlorotrifluoro ethylene) (P(VDF-TrFE-CTFE)).

Each electrode $E_0$, $E_{ref}$, and $E_{out}$ is made of an electrically-conductive material. According to an embodiment, each electrode is made of a metal selected from the group comprising gold, copper, silver, titanium, and metal alloys comprising at least one of these metals. According to an embodiment, each electrode $E_0$, $E_{ref}$, and $E_{out}$ is made of an electrically-conductive polymer, for example, poly(3,4-ethylenedioxythiophene):poly(styrene sulfonate), currently called PEDOT:PSS. According to another embodiment, each electrode is a conductive layer based on a composite of conductive particles (silver particles, silver nanowires, carbon nanotubes) and of a matrix material such as a polymer, which is the guarantee of the electrode flexibility.

Beam P and layers $C_1$ and $C_{out}$ have, in top view, substantially equal areas. According to an embodiment, electrodes $E_0$, $E_{ref}$ and $E_{out}$ have a rectangular shape.

Contact pads $E_0$-A, $E_{ref}$-A and $E_{out}$-A have been very schematically shown, respectively for electrodes $E_0$, $E_{ref}$ and $E_{out}$, in FIG. 2B. These contact pads are for example extensions $E_0$-A, $E_{ref}$-A, and $E_{out}$-A positioned on the side of support S. Extensions $E_0$-A, $E_{ref}$-A, and $E_{out}$-A may enable to connect the electrodes to a control circuit, not shown.

Beam P and stack $E_T$ may have a length L greater than 10 mm, for example, in the range from 10 mm to 100 mm, for example, in the order of 50 mm. Beam P and stack $E_T$ may have a width l in the range from 100 μm to 10 mm, for example, in the order of 1 mm. Beam P has a thickness Hp in the range from 50 μm to 1 mm, for example, in the order of 100 μm. Layer $C_1$ has a thickness $H_1$ in the range from 500 nm to 10 μm, for example, in the order of 2 μm. Layer $C_{out}$ has a thickness $H_{out}$ in the range from 1 μm to 100 μm, for example, in the order of 10 μm. Electrodes $E_0$, $E_{ref}$, and $E_{out}$ may have a thickness in the range from 100 nm to 10 μm, for example, in the order of 500 nm.

The operation of piezoelectric voltage transformer 20 will now be described. A periodic voltage $V_1$ is applied between electrode $E_0$ and electrode $E_{ref}$. Piezoelectric layer $C_1$ mechanically vibrates by reverse piezoelectric effect. The mechanical vibration is communicated to stack $E_T$ and to beam P. Thus, piezoelectric layer $C_{out}$ vibrates and generates a periodic voltage $V_2$, between electrodes $E_{out}$ and $E_{ref}$, by direct piezoelectric effect. As an example, electrode $E_{ref}$ may be connected to a source of a reference potential, for example, the ground, not shown in the drawings. According to an embodiment, electrode $E_0$ may be connected to a source of an input potential $V_{dd}$. The value of potential $V_{dd}$ is selected to obtain, with the reference potential, voltage $V_1$ between electrodes $E_0$ and $E_{ref}$. According to previously-described relation (1), voltages $V_1$ and $V_2$ are linked to each other by the following relation (2):

$$\frac{V_1}{H_1} = \frac{V_2}{H_{out}} \quad (2)$$

The amplification factor of the transformer thus is the ratio of thickness $H_{out}$ of layer $C_{out}$ to thickness $H_1$ of layer $C_1$. Thicknesses $H_1$ and $H_{out}$ are thus selected according to the desired amplification factor.

According to an embodiment, the resonance frequency of beam P is substantially equal to the frequency of periodic voltage $V_1$, to minimize mechanical losses. Beam P may further have an effect on the mechanical behavior of transformer 20.

Figure 3A:
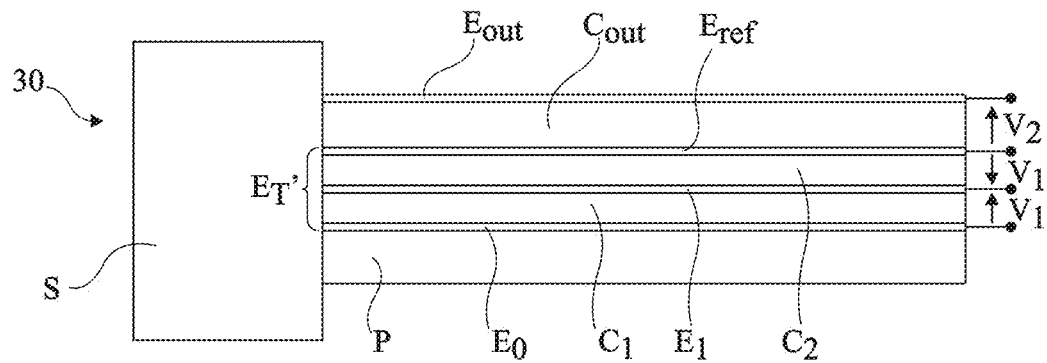
FIGS. 3A to 3C illustrate alternative embodiments of the piezoelectric voltage transformer shown in FIGS. 2A and 2B.
Figure 3B:
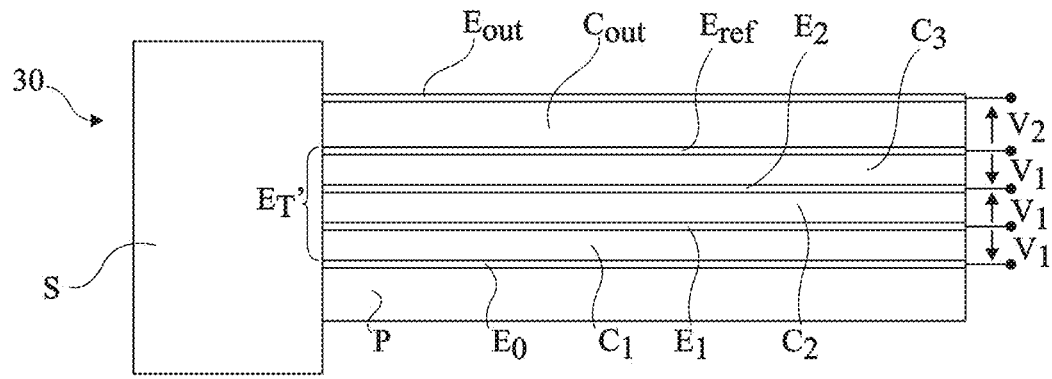
Figure 3C:
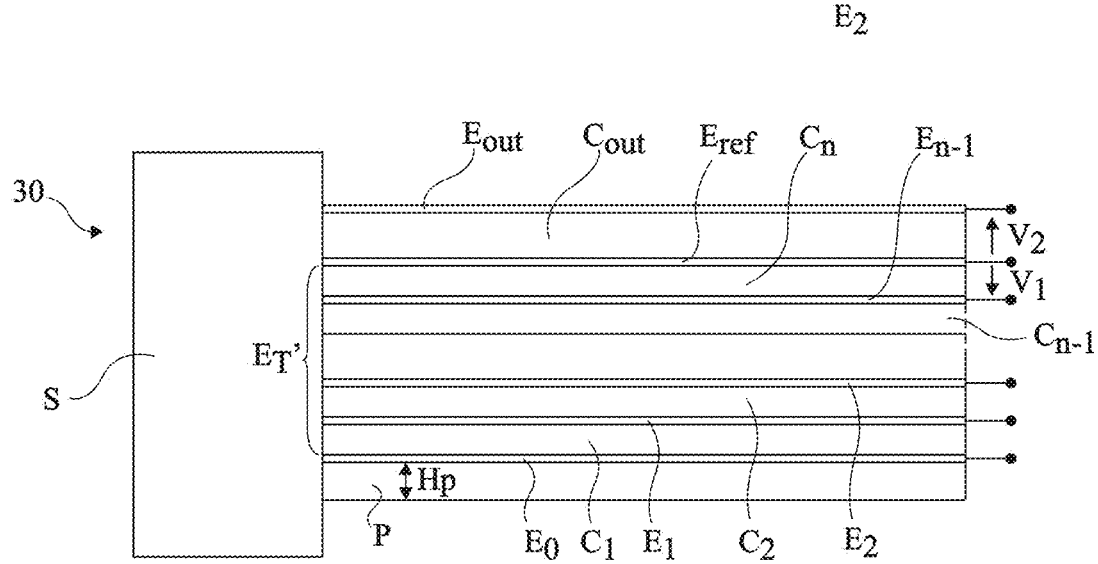

FIGS. 3A to 3C are cross-section views of embodiments of piezoelectric voltage transformers 30. These piezoelectric voltage transformers are of the same type as that described in relation with FIGS. 2A and 2B, with the difference that piezoelectric layer $C_1$ is comprised in a stack $E_{T'}$ of piezoelectric layers and of electrodes.

The piezoelectric layers of stack $E_{T'}$ for example have the same thickness or different thicknesses. The piezoelectric layers of stack $E_{T'}$ are made of piezoelectric polymer materials. The piezoelectric layers of stack $E_{T'}$ are preferably made of a same material. However, layer $C_{out}$ may be made of a material different from that of the piezoelectric layers of stack $E_{T'}$.

The piezoelectric layers of stack $E_{T'}$ are each for example made of a PVDF-based compound. The PVDF-based compound may comprise the PVDF polymer alone, a single copolymer of PVDF, a mixture of two or more than two PVDF copolymers, or a mixture of the PVDF polymer and of at least one PVDF copolymer. Preferably, the PVDF copolymer is poly(vinylidene fluoride-trifluoro ethylene) (P(VDF-TrFE)), particularly $P(VDF_x\text{-}TrFE_{100-x})$ where x is a real number between 60 and 80, particularly approximately 70, poly(vinylidene fluoride), poly((vinylidene fluoride-tri-fluoroethylene-chlorofluoroethylene) (P(VDF-TrFE-CFE), or poly((vinylidene fluoride-trifluoroethylene-chlorotrifluoro ethylene) (P(VDF-TrFE-CTFE)).

The electrodes of stack $E_{T'}$ are made of an electrically-conductive material. According to an embodiment, the electrodes of stack $E_{T'}$ are made of a metal selected from the group comprising gold, copper, silver, titanium, and metal alloys comprising at least one of these metals. According to an embodiment, each electrode of stack $E_{T'}$ is made of an electrically-conductive polymer, for example, of poly(3,4-ethylenedioxythiophene):poly(styrene sulfonate), currently called PEDOT:PSS. According to another embodiment, each electrode is a conductive layer based on a composite of conductive particles (silver particles, silver nanowires, carbon nanotubes) and of a matrix material such as a polymer, which is the guarantee of the electrode flexibility.

FIG. 3A illustrates the case where stack $E_{T'}$ comprises two piezoelectric layers $C_1$ and $C_2$ separated by an electrode $E_1$. More particularly, stack $E_{T'}$ successively comprises:

piezoelectric layer $C_1$ resting on electrode $E_0$, for example, in contact with electrode $E_0$;

electrode $E_1$ resting on piezoelectric layer $C_1$, for example, in contact with layer $C_1$; and piezoelectric layer C2 resting on electrode $E_1$, for example, in contact with electrode $E_1$.

Electrode $E_{ref}$ then rests on layer C2, for example in contact with layer $C_2$.

In the same way as with transformer 1 previously described in relation with FIGS. 2A and 2B, layers $C_1$ and $C_2$ are excited by voltage $V_1$. Voltage $V_2$ is then generated between electrodes $E_{ref}$ and $E_{out}$ by layer $C_{out}$, by direct piezoelectric effect. According to an embodiment, electrode $E_{ref}$ is connected to the source of the reference potential. In this case, electrode $E_0$ is further connected to the source of the reference potential. Electrode $E_1$ is connected to the source of potential $V_{dd}$.

FIG. 3B illustrates the case where stack $E_{T'}$ comprises three piezoelectric layers $C_1$, $C_2$, and $C_3$ separated by two electrodes $E_1$ and $E_2$. More particularly, stack $E_{T'}$ successively comprises:

piezoelectric layer $C_1$ resting on electrode $E_0$, for example, in contact with electrode $E_0$;

electrode $E_1$ resting on piezoelectric layer $C_1$, for example, in contact with layer $C_1$;

piezoelectric layer $C_2$ resting on electrode $E_1$, for example, in contact with electrode $E_1$;

electrode $E_2$ resting on piezoelectric layer $C_2$, for example, in contact with layer $C_2$; and piezoelectric layer $C_3$ resting on electrode $E_2$, for example, in contact with electrode $E_2$.

Electrode $E_{ref}$ rests on layer $C_3$, for example in contact with layer $C_3$.

In the same way as with transformer 1 previously described in relation with FIGS. 2A and 2B, layers $C_1$ and $C_2$ are excited by voltage $V_1$. Voltage $V_2$ is then generated between electrodes $E_{ref}$ and $E_{out}$ by layer $C_{out}$. According to an embodiment, electrode $E_{ref}$ is connected to the source of the reference potential. In this case, electrodes $E_0$ and $E_2$ are connected to the source of potential $V_{dd}$. Electrode $E_1$ is connected to the source of the reference potential.

FIG. 3C illustrates the case where stack $E_T'$ comprises n piezoelectric layers $C_1, C_2, \ldots, C_n$ separated by n−1 electrodes $E_1, \ldots, E_{n-1}$, n being an integer for example in the range from 2 to 20 such that the sum of the thicknesses of layers $C_1, C_2, \ldots, C_n$ and of the thicknesses of electrodes $E_1, \ldots, E_{n-1}$ is smaller than thickness Hp of the beam. First layer $C_1$ rests on electrode $E_0$, for example in contact with electrode $E_0$. First electrode $E_1$ rests on layer $C_1$, for example in contact with layer $C_1$. Thus, each layer $C_i$, i being an integer in the range from 2 to n, respectively rests on electrode $E_{i-1}$, for example in contact with electrode $E_{i-1}$. And each electrode $E_{i-1}$ respectively rests on layer $C_{i-1}$, for example in contact with layer $C_{i-1}$. Electrode $E_{ref}$ rests on the last layer $C_n$ of stack $E_T'$, for example in contact with layer $C_n$.

In the same way as with transformer 20 previously described in relation with FIGS. 2A and 2B, layers $C_1, C_2, \ldots, C_n$ are excited by voltage $V_1$. Voltage $V_2$ is then generated between electrodes $E_{ref}$ and $E_{out}$ by layer $C_{out}$. According to an embodiment, electrode $E_{ref}$ is connected to the source of the reference potential. Electrodes $E_0, E_1, \ldots, E_{n-1}$ are each connected to the source of the reference potential or to the source of potential $V_{dd}$. To apply a voltage $V_1$ to each piezoelectric layer $C_1, C_2, \ldots, C_n$, two types of connection of electrodes $E_1, E_2, \ldots, E_{n-1}$ are possible.

When stack $E_T'$ comprises an even number n of piezoelectric layers, electrodes $E_1, E_3, \ldots, E_{n-1}$ are connected to potential source $V_{dd}$ and electrodes $E_0, E_2, \ldots E_{n-2}$ are connected to the reference potential source.

When stack $E_T'$ comprises an odd number n of piezoelectric layers, electrodes $E_1, E_3, \ldots, E_{n-2}$ are connected to the reference potential source and electrodes $E_0, E_2, \ldots E_{n-1}$ are connected to the source of potential $V_{dd}$.

An advantage of this embodiment is to enable the piezoelectric voltage transformer to supply a greater output power. Indeed, by applying n times voltage $V_1$, the input power, and thus the output power, is multiplied by n.

Figure 4:
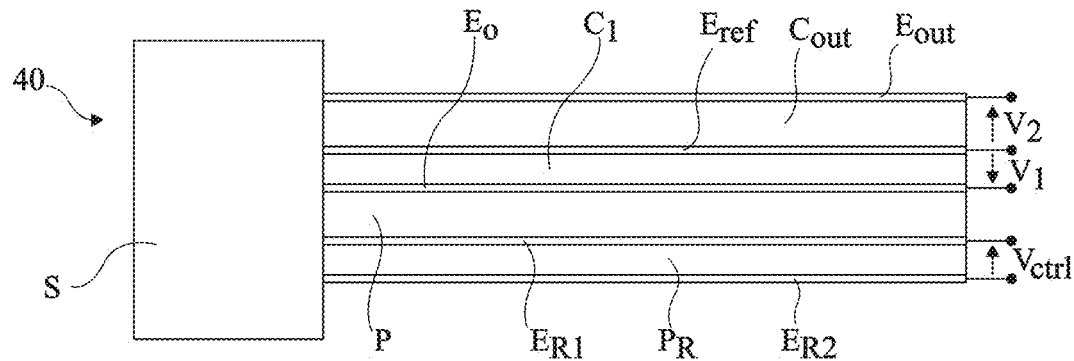
FIGS. 4 and 5 illustrate other embodiments of a piezoelectric voltage transformer.

FIG. 4 is a cross-section view of an embodiment of a piezoelectric voltage transformer 40. Transformer 40 is of the same type as transformer 20 described in relation with FIGS. 2A and 2B. However, transformer 40 comprises, in addition to beam P, a beam $P_R$ of variable stiffness. The upper surface of beam $P_R$ is in contact with an electrode $E_{R1}$ and the lower surface of beam $P_R$, opposite to the upper surface, is in contact with an electrode $E_{R2}$. Further, if stack $E_T$ is in contact with the upper surface of beam P, the free surface of electrode $E_{R1}$ is in contact with the lower surface, opposite to the upper surface, of beam P. Beam $P_R$ may be made of a piezoelectric polymer material. The stiffness of beam $P_R$ is controlled by direct piezoelectric effect. Beam $P_R$ is for example made of a PVDF-based compound. The PVDF-based compound may comprise the PVDF polymer alone, a single copolymer of PVDF, a mixture of two or more than two PVDF copolymers, or a mixture of the PVDF polymer and of at least one PVDF copolymer. Preferably, the PVDF copolymer is poly(vinylidene fluoride-trifluoro ethylene) (P(VDF-TrFE)), particularly P(VDF$_x$-TrFE$_{100-x}$) where x is a real number between 60 and 80, particularly approximately 70, poly(vinylidene fluoride), poly((vinylidene fluoride-trifluoroethylene-chlorofluoroethylene) (P(VDF-TrFE-CFE), or poly((vinylidene fluoride-trifluoro-ethylene-chlorotrifluoro ethylene) (P(VDF-TrFE-CTFE)). Beam $P_R$ has a length for example in the range from 10 mm to 100 mm, for example, in the order of 50 mm. Beam $P_R$ has a width for example in the range from 100 µm to 10 mm, for example, in the order of 1 mm. Beam $P_R$ has a thickness for example in the range from 500 nm to 10 µm, for example, in the order of 2 µm.

Electrodes $E_{R1}$ and $E_{R2}$ are made of an electrically-conductive material. According to an embodiment, electrodes $E_{R1}$ and $E_{R2}$ are made of a metal selected from the group comprising gold, copper, silver, titanium, and metal alloys comprising at least one of these metals. According to an embodiment, each electrode $E_{R1}$ and $E_{R2}$ is made of an electrically-conductive polymer, for example, of poly(3,4-ethylenedioxythiophene):poly(styrene sulfonate), currently called PEDOT:PSS. According to another embodiment, each electrode is a conductive layer based on a composite of conductive particles (silver particles, silver nanowires, carbon nanotubes, . . . ) and of a matrix material such as a polymer, which is the guarantee of the electrode flexibility.

The operation of this embodiment will now be described. By applying a DC voltage $V_{ctrl}$ between electrodes $E_{R1}$ and $E_{R2}$, mechanical stress is created by piezoelectric effect in beam $P_R$. This causes a modification of the resonance frequency of beam P. The resonance frequency of beam P can thus be controlled according to voltage $V_{ctrl}$. Modifying the resonance frequency of beam P can enable to adjust the resonance frequency of the transformer, for example, to compensate for parasitic variations. The parasitic variations may be due to the dispersion of the methods or to certain environmental conditions such as temperature.

Figure 5:
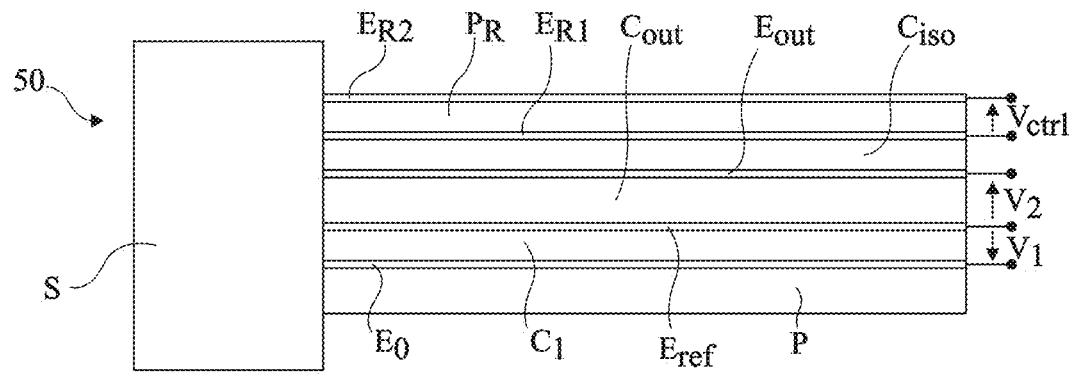

FIG. 5 is a cross-section view of an embodiment of a piezoelectric voltage transformer 50. Transformer 50 is of the same type as transformer 40 described in relation with FIG. 4. However, transformer 50 further comprises an electrically-insulating layer $C_{iso}$, having its upper surface resting on and for example in contact with the upper surface of output electrode $E_{out}$. Beam $P_R$ of variable stiffness and electrodes $E_{R1}$ and $E_{R2}$ may be positioned on and in contact with insulating layer $C_{iso}$. The operation of transformer 50 is the same as that of transformer 40 described in relation with FIG. 4.

Specific embodiments have been described. Various alterations, modifications, and improvements will occur to those skilled in the art. In particular, beam $P_R$ and electrodes $E_{R1}$ and $E_{R2}$ may be for example arranged between beam P and an insulating layer $C_{iso}$ which would have stack $E_T$ resting thereon.

Various embodiments with various variations have been described hereabove. It should be noted that those skilled in the art may combine various elements of these various embodiments and variations without showing any inventive step. In particular, the embodiments previously described in relation with FIGS. 4 and 5 are compatible with the embodiments previously described in relation with FIGS. 3A to 3C.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A voltage transformer comprising a beam or membrane made of a first polymer material having a resonance frequency in the range from 1 Hz to 1,000 Hz and comprising on said beam or membrane a stack successively comprising:
   a first electrode;

a first piezoelectric layer made of a second polymer material;

a second electrode;

a second piezoelectric layer made of a third polymer material identical to the second polymer material or different from the second polymer material;

a third electrode;

a support and wherein the beam or membrane is fastened by one of its longitudinal ends to the support; and an element, having an electrically controllable stiffness, in contact with the stack or in contact with the beam or membrane;

so that the resonance frequency can be adjusted within the range by applying a DC voltage between the first electrode and the second electrode.

2. The transformer of claim 1, wherein the first polymer material has a Young's modulus smaller than 10 GPa;

so that the resonance frequency can be adjusted within the range.

3. The transformer of claim 1, wherein the first polymer material is polyethylene naphthalate or polyethylene terephthalate.

4. The transformer of claim 1, wherein the second and third polymer materials comprise polyvinylidene fluoride and/or at least one copolymer of polyvinylidene fluoride, including a polymer selected from the group comprising polyvinylidene fluoride, poly(vinylidene fluoride trifluoroethylene), poly(vinylidene fluoride tetrafluoroethylene), and a mixture of at least two of these polymers.

5. The transformer of claim 1, wherein the second polymer material and the third polymer material are identical and the thickness of the first layer is different from the thickness of the second layer.

6. The transformer of claim 1, wherein the beam or membrane has a length in the range from 1 mm to 100 mm and a thickness in the range from 50 µm to 200 µm, and wherein the first and second layers have a thickness in the range from 1 µm to 50 µm.

7. The transformer of claim 1, wherein the stack further successively comprises, between the first piezoelectric layer and the second electrode, a fourth electrode and a third piezoelectric layer made of a fourth polymer material.

8. The transformer of claim 7, wherein the fourth polymer material comprises polyvinylidene fluoride and/or at least one copolymer of polyvinylidene fluoride, including a polymer selected from the group comprising polyvinylidene fluoride, poly(vinylidene fluoride-tri fluoro ethylene), poly(vinylidene fluoride-tetra fluoro ethylene), and a mixture of at least two of these polymers.

9. The transformer of claim 7, comprising means of application of a first voltage between the fourth electrode and the first electrode and between the fourth electrode and the second electrode and comprising means for recovering a second voltage between the third electrode and the second electrode.

10. The transformer of claim 7, wherein the stack further successively comprises, between the third layer and the second electrode, a fifth electrode and a fourth piezoelectric layer made of a fifth polymer material.

11. The transformer of claim 10, wherein the fifth polymer material comprises polyvinylidene fluoride and/or at least one copolymer of polyvinylidene fluoride, including a polymer selected from the group comprising polyvinylidene fluoride, poly(vinylidene fluoride-tri fluoro ethylene), poly(vinylidene fluoride-tetra fluoro ethylene), and a mixture of at least two of these polymers.

12. The transformer of claim 10, comprising means of application of a first voltage between:

the first electrode and the fourth electrode;

the fifth electrode and the fourth electrode; and the fifth electrode and the second electrode, and comprising means for recovering a second voltage between the third electrode and the second electrode.

13. The transformer of claim 12, wherein the element having a controllable stiffness comprises a fifth piezoelectric layer made of a sixth polymer material.

* * * * *